United States Patent [19]
Dravida et al.

[11] Patent Number: 5,251,215
[45] Date of Patent: Oct. 5, 1993

[54] MODIFYING CHECK CODES IN DATA PACKET TRANSMISSION

[75] Inventors: Subrahmanyam Dravida, Highland Park; Daniel S. Greenberg; David J. Hodgdon, both of Troy Hills, all of N.J.

[73] Assignee: AT&T Bell Laboratories, Murray Hill, N.J.

[21] Appl. No.: 819,554

[22] Filed: Jan. 13, 1992

[51] Int. Cl.⁵ .............................................. G06F 11/08
[52] U.S. Cl. ...................................... 370/94.1; 370/99; 371/37.1; 371/37.7; 371/38.1; 371/39.1; 371/44; 341/94
[58] Field of Search ................. 370/94.1, 99; 341/94; 371/37.1, 37.7, 38.1, 39.1, 44

[56] References Cited

U.S. PATENT DOCUMENTS

| | | | |
|---|---|---|---|
| 3,872,430 | 3/1975 | Boudreau et al. | 371/37.1 |
| 4,577,313 | 3/1986 | Sy | 370/99 |
| 4,720,830 | 1/1988 | Joshi et al. | 371/37.1 |
| 5,121,396 | 6/1992 | Irvin et al. | 371/37.1 X |

OTHER PUBLICATIONS

D. R. Irvin, "Preserving the Integrity of Cyclic-Redundancy Checks When Protected Text is Intentionally Altered," *IBM J. Res. Develop.*, vol. 33, No. 6 (Nov. 1989), pp. 618-626.

*Primary Examiner*—Douglas W. Olms
*Assistant Examiner*—Russell W. Blum
*Attorney, Agent, or Firm*—Lester H. Birnbaum

[57] ABSTRACT

Disclosed is a method and circuit for modifying the check code of a data packet based on a first seed to accommodate the addition or substraction of a header. A number of bits, which include a second seed, an exclusive OR function of the first seed and a portion of a header, and a string of zeros dependent upon the length of an incoming data packet, is sent through a CRC generator. The resulting CRC calculation and the incoming packet check code are exclusive ORed to produce a modified check code taking into account the addition or substraction of the header.

14 Claims, 3 Drawing Sheets

MODIFYING CHECK CODES IN DATA PACKET TRANSMISSION

BACKGROUND OF THE INVENTION

This invention relates to data packet transmission.

Each data packet transmitted in digital loop carrier transmission systems normally includes a cyclic redundancy check (CRC) code at the end of the packet to permit checking for any data errors during transmission. In some systems, such as those employing front end statistical multiplexing where a plurality of end users share the same bandwidth, it is required that the remote terminal (RT) which receives a packet from the end user add a header to the packet before re-transmitting it to the central office or substract a header when receiving a packet from the central office before re-transmitting it to the end user. When the packet comes in, the RT will inspect the check code and, assuming it is valid, discard the check code. After a header is added or substracted from the packet, the RT will then calculate a new check code to take into account the change in the header field before re-transmitting the packet.

A problem with present systems is that the data is vulnerable in the time between the inspection of the old check code and the addition of the new check code. That is, the new check code will not permit detection of any changes in the data during the time that the packet is without a check code since the calculation is based on the data on hand rather than the data originally received by the RT.

A proposal has been made to modify the received check code when one header is substituted for another based on the difference between the two headers. (See U.S. patent application of S. Dravida, Ser. No. 07/584,211, filed Sep. 18, 1990, assigned to the present assignee and incorporated by reference herein.) While that approach is generally useful, it cannot be easily employed when the packet length is variable and a seed which is not equal to zero is required for the CRC calculation.

SUMMARY OF THE INVENTION

The invention, in one aspect, is a method of re-transmitting an incoming data packet which includes a data field and a cyclic redundancy check code based on a first seed field having a first bit length. The data packet is received and a bit stream is generated. The bit stream comprises a second seed field and a field comprising the exclusive OR function of at least a portion of the first seed bits and at least a portion of a header. The bit stream also comprises a number of zeros equal to the bit length of the data field of the incoming packet.

The bit stream is loaded into a CRC generator to produce an updated CRC code. The updated CRC code and the CRC code of the incoming packet are exclusive ORed to produce a modified CRC code for the data packet. The modified data packet is re-transmitted with the modified CRC code.

In accordance with another aspect, the invention is a circuit for re-transmitting an incoming data packet which includes a data field and a cyclic redundancy check code based on a first seed field having a first bit length. The circuit includes means for receiving the data packet. Means are also provided for generating a bit stream which includes a second seed field, a field comprising the exclusive OR function of at least a portion of a header and at least a portion of the first seed field, and a string of zeros equal to the bit length of the data field of the incoming packet. The circuit further comprises a CRC generator, means for loading the bit stream into the generator, and means for exclusive ORing the updated CRC code generated at the output of the generator with the CRC code of the incoming packet to produce a modified CRC code. Means are further provided for re-transmitting the modified data packet with the modified CRC code.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
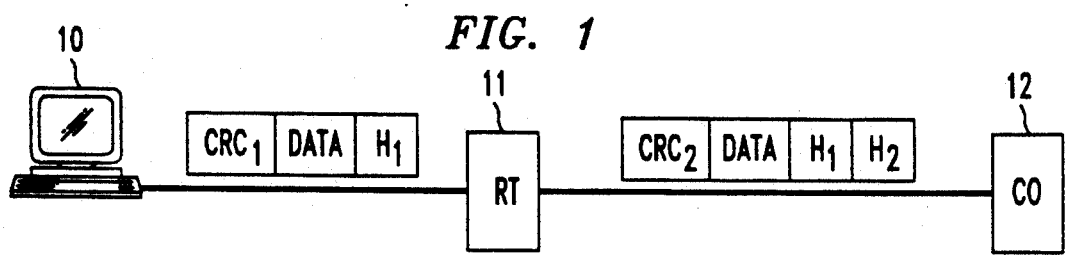
FIG. 1 is a block diagram of some basic elements of a digital loop carrier transmission system.

FIG. 1 illustrates in block form a basic form of data packet transmission in which the invention may be employed. A customer, illustrated by computer terminal, 10, transmits a data packet to a remote terminal (RT) 11. The packet, as illustrated, may (or may not) include a header field, $H_1$, followed by data field, and a check code field, $CRC_1$, which is formed by a cyclic redundancy check (CRC) calculation. After the remote terminal receives the packet, it adds a new header field $H_2$ onto the beginning of the incoming packet and provides a modified CRC check code ($CRC_2$) field at the end of the packet to take into account the addition of the header. The RT then re-transmits the data packet to the central office (CO), 12. In the reverse direction, the RT will remove the additional header ($H_2$) from the packet and provide a modified CRC code to take into account the elimination of the additional header before re-transmitting to the customer, 10.

Figure 2:
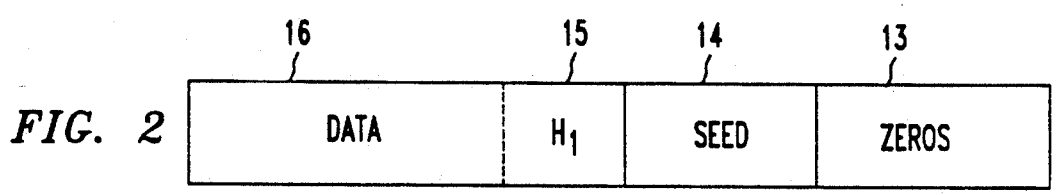
FIGS. 2-4 are block diagrams of bit streams which are useful in the present invention.

FIG. 2 illustrates a bit stream which produces the $CRC_1$ code at the customer terminal 10. The bit stream can be preceded by a field, 13, of any number of zeros. A first seed field, 14, is included and comprises a fixed number to permit the CRC generator (not shown) in the terminal 10 to distinguish the data from a string of zeros. A customer's header field ($H_1$), designated 15, may precede the data field 16. It will be noted that the division between $H_1$ and the data field is a dashed line since, for purposes of this invention, the customer header is considered part of the data field.

Figure 3:
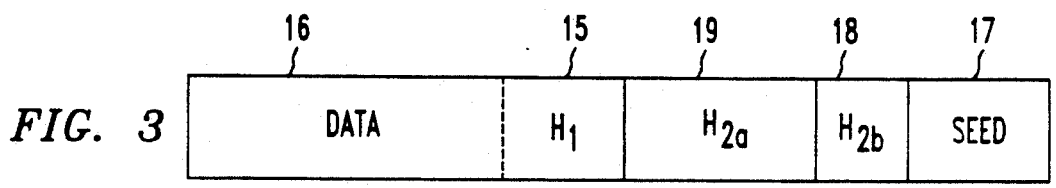

When the data packet with the resulting $CRC_1$ code arrives at the remote terminal, 11, it is desired to calculate $CRC_2$ as if it were generated from the bit stream with the general form illustrated in FIG. 3. That is, the packet will include a fixed second seed field, 17, which is or is not the same as the seed field, 14, with a new header field designated $H_{2a}$ and $H_{2b}$ (19 and 18, respectively), added onto the customer header, 15, and the data field 16. When a bit stream such as shown in FIG. 3 is sent through a CRC generator, the appropriate $CRC_2$ code will be generated to take into account the additional header. However, as previously described, recalculating the CRC code leaves the data vulnerable for some finite period of time.

Figure 4:
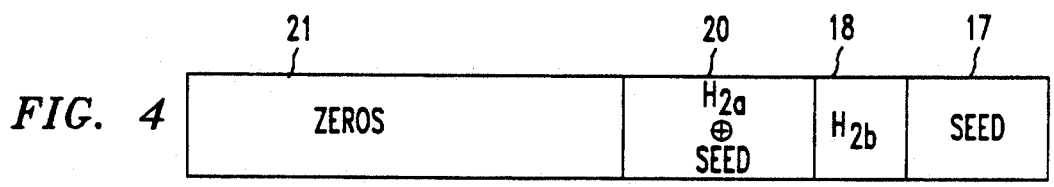

In accordance with a feature of the invention, a bit stream such as shown in FIG. 4 is generated at the remote terminal to modify the original CRC code ($CRC_1$) of the incoming packet. This packet includes the second seed field 17, and a portion of the added header ($H_{2b}$) designated 18. The next field, 20, is the exclusive OR of another portion of the added header ($H_{2a}$) and the first seed field 14. The portion, $H_{2a}$, of the added header which is exclusive ORed with the seed will be the least significant bits of the added header ($H_{2a}$, $H_{2b}$) which equal in number the bits of the seed field 14 for reasons to be explained. The portion $H_{2b}$ will be the most significant bits of the header which exceed the number of bits used in the exclusive OR function. The added header is followed by a portion, 21, which consists of a string of zeros equal in number to the bit length of the data field of the incoming packet (including data portion 16 and header 15).

It should be appreciated that if a CRC calculation is made of the generated bit stream of FIG. 4 and that calculation is exclusive ORed with the CRC code ($CRC_1$) of the bit stream of FIG. 2, the result is essentially the CRC code for the bit stream of FIG. 3. This is so since, it will be noted, the exclusive OR of the bit streams of FIGS. 2 and 4 is equal to the bit stream of FIG. 3. A major distinction, however, is that a CRC update code calculated from the bit stream of FIG. 4 will be independent of the contents of the data field. When this update term is exclusive ORed with the CRC code ($CRC_1$) of the incoming packet, the resulting modified CRC code ($CRC_2$) will be based solely on $CRC_1$ and the length of the data field as it was received by the RT and not on the content of the data field which existed at the time of changing the code. This means that if any data was altered after $CRC_1$ was generated at terminal 10 but before the modification of $CRC_1$ into $CRC_2$, the modified CRC code ($CRC_2$) will not agree with the data of the outgoing packet and the error will be detected at the central office.

A further important feature is the exclusive OR of the $H_{2a}$ portion of the header with the seed 14 to form field 20. This field allows an exclusive OR of the $CRC_1$ code and the CRC update term even though the incoming and outgoing packets are not the same length as the result of adding the header. That is, it can be shown mathematically that exclusive ORing the portion of the header ($H_{2a}$) which equals in length the bit length of the seed field 14 will align appropriate terms in the polynominals used in the CRC calculation.

Figure 5:
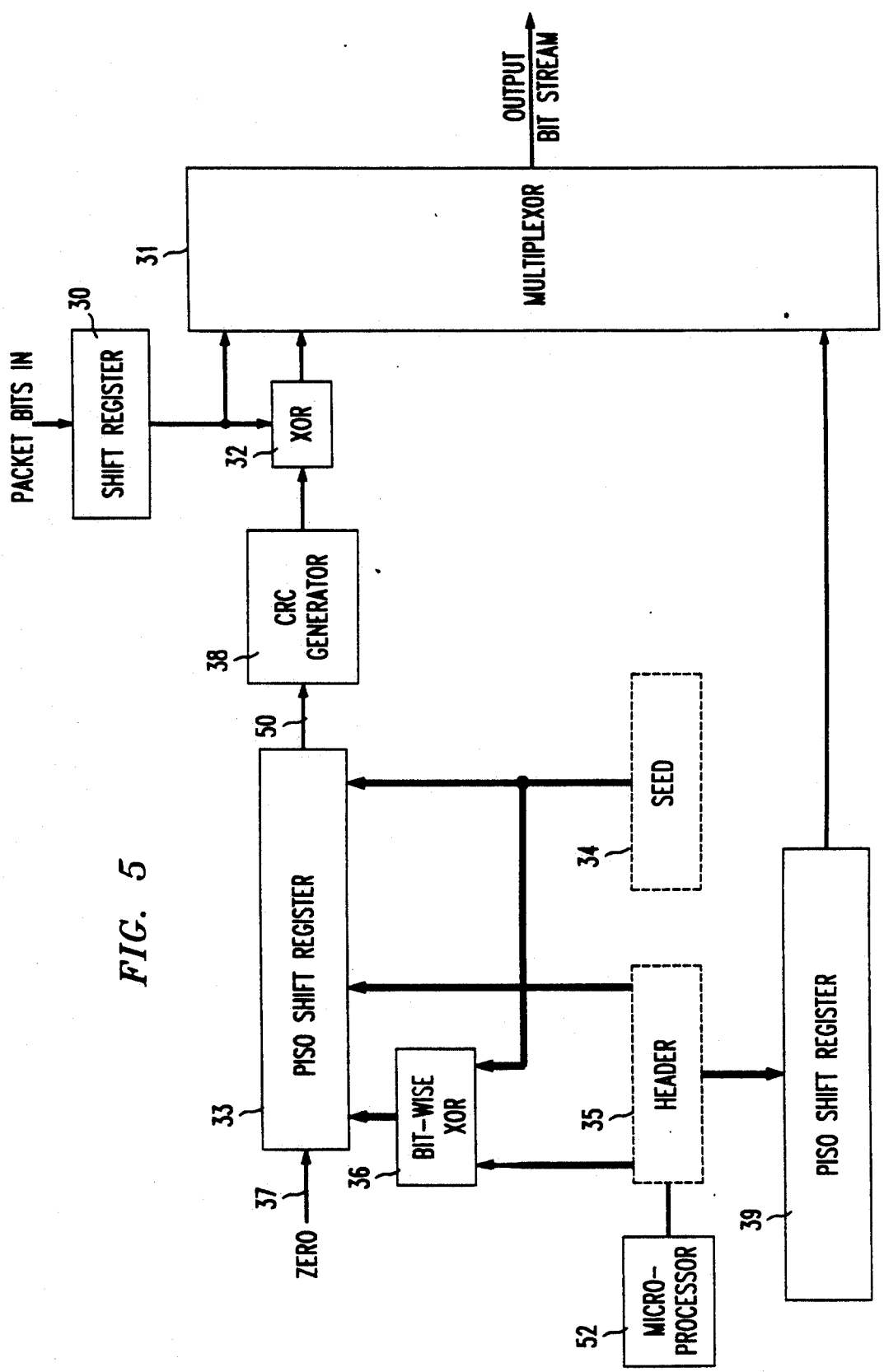
FIG. 5 is a block diagram of a circuit in accordance with an embodiment of the invention.
Figure 6:
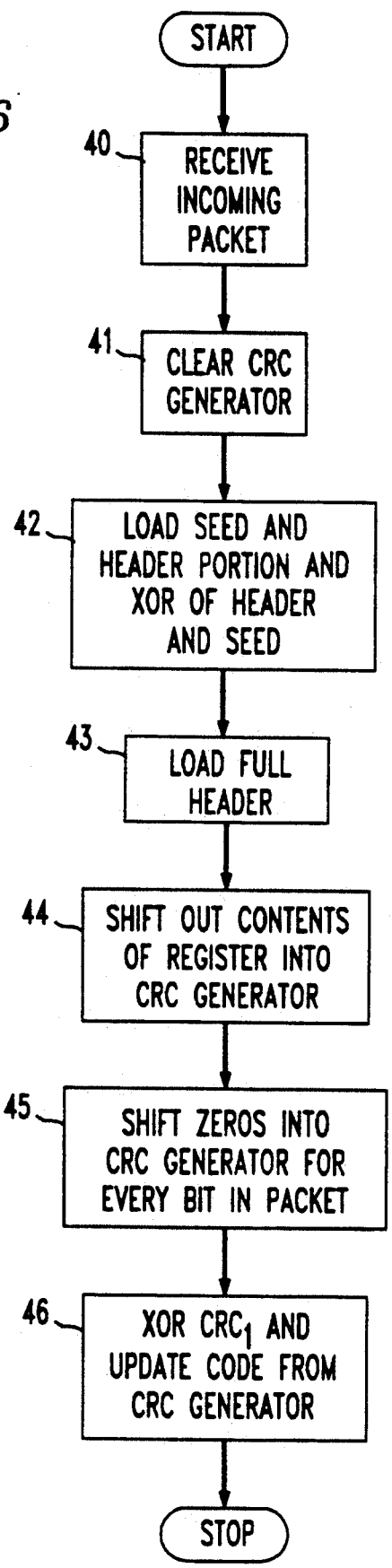
FIG. 6 is a flow diagram illustrating a method in accordance with an embodiment of the invention.

FIG. 5 illustrates one example of a circuit which may be employed in accordance with the invention while FIG. 6 depicts a flow diagram to illustrate an example of the method of the invention. The circuit of FIG. 5 includes a shift register, 30, for receiving incoming packets. The output of the shift register, 30, is coupled through a multiplexer, 31, to the output of the circuit. The output of shift register 30 is also coupled to a gate, 32, for performing an exclusive OR function.

A first parallel-in, serial out shift register, 33, is adapted to receive the seed (14 of FIG. 1) and header ($H_{2a}$, $H_{2b}$ of FIG. 3), illustrated here as dotted line blocks 34 and 35, respectively. The seed and header are typically stored in digital hardware registers or hardwired to permanent digital valves. The header may be calculated by a microprocessor 52 based on the position of the circuit in the channel bank. A bit-wise exclusive OR gate, 36, is adapted to receive the seed and the least significant bits of the header which equal in number the bit length of the seed. The output of the gate 36 is coupled to the shift register 33. Also coupled to the shift register 33 is a lead for providing a permanently wired string of zeros to the shift register.

The output of the shift register, 33, is coupled to a CRC generator, 38, which can be a standard type. The output of the CRC generator is coupled to the exclusive OR gate, 32, previously mentioned. The output of the gate, 32, is coupled through multiplexer 31 to the output.

A second parallel-in, serial out shift register, 39, is adapted to receive the full header. The output of this register is also coupled through multiplexer 31 to the output.

A typical sequence of events will now be described with reference to FIGS. 5 and 6. The incoming packet is received by shift register 30 as indicated by block 40. The CRC generator 38 is then cleared as shown in block 41. As shown in step 42, the shift register, 33, is loaded with the second seed field, the most significant bit portion of the header ($H_{2b}$) in excess of the bit length of the first seed field (14), and the least significant bit portion of the header ($H_{2a}$) equal to the bit length of the first seed field which is exclusive ORed with the seed (i.e., the fields 17, 18 and 20 of FIG. 4). In step 43, the full header ($H_{2a}$, $H_{2b}$) is loaded into shift register 39, and at the appropriate time is sent to the output through multiplexer 31. After the header is sent out, the contents of the data packet in register 30 will also be shifted to the output through multiplexer 31.

In the meantime, the contents of register 33 are shifted into the CRC generator in accordance with step 44. As each bit is shifted out of register 33, a zero will be shifted into the register from line 37. Thus, once the original contents of register 33 are shifted out, a string of zeros is shifted into register 33, ensuring that line 50 provides a constant string of zeros. According to step 45, the string of zeros on line 50 will be shifted into CRC generator 38. The number of zeros shifted on line 50 will be equal to the length of the data field, including $H_1$, from the incoming packet, but excluding the length of the original ($CRC_1$) check code. The number of zeros is determined, therefore, based on the end of the packet in shift register 30, which is normally sensed by standard control logic (not shown) that is usually a portion of any remote terminal.

When the CRC generator has provided the calculation of the update code based on the contents of shift register 33, and the incoming packet, except for $CRC_1$, has been shifted out of register 30, the update code and the original code are exclusive ORed in gate 32 to produce the modified CRC code according to step 46. This modified code ($CRC_2$) is sent to the output through multiplexer 31.

While the invention has been described primarily for the case where a header ($H_{2a}$, $H_{2b}$) is added to a packet, it can also be applied in the other direction where the header is removed from the packet. In such a case, the bit stream of FIG. 4 would, again, be generated to form the update code while the bit stream of FIG. 3 would be the incoming packet which includes the "old" code. Thus, exclusive ORing of the codes of FIGS. 3 and 4 would produce a modified CRC code which is appropriate for the outgoing packet.

Figure 7:
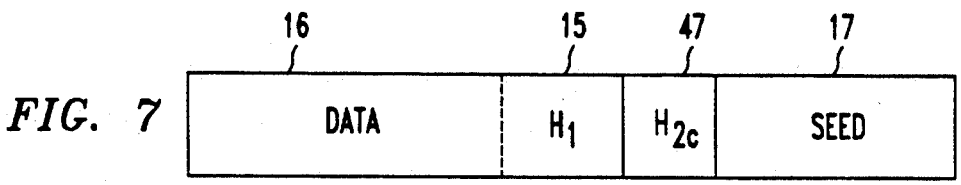
FIGS. 7-8 are block diagrams of bit streams which are also useful in the present invention.
Figure 8:
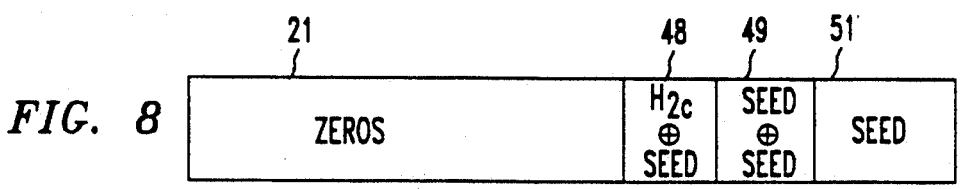

It is also possible that the header to be added or subtracted have a bit length which is less than the seed field (14). In such a case, the bit streams of FIGS. 7 and 8 would be substituted for those of FIGS. 3 and 4 in achieving the appropriate update code. That is, it is desired to get a CRC calculation based on the bit stream of FIG. 7 which now includes a header $H_{2c}$ with a length less than the seed field, 14, of FIG. 2. In order to accomplish this, the bit stream of FIG. 8 is generated. This stream now includes a field, 48, consisting of the exclusive OR of the header, $H_{2c}$, and the least significant bits of the seed field, 14, equal in length to the header. The next field, 49, now includes the excess most significant bits of seed, 14, exclusive ORed with the least significant bits of seed field 17 equal in length to the excess bits of seed field 14. Field, 51, then consists of the excess most significant bits of seed field 17 which were not involved in the exclusive OR calculated with the seed field 14.

It will also be appreciated that several other variations are possible. For example, it is possible to pre-load the seed into the CRC generator 38 when the generator is cleared rather than shifting the seed from register 33. A first in-first out (FIFO) memory could replace serial register 30 so that a group of bits could be processed simultaneously. Also, the CRC generator may work in parallel to process a number of bits at a time.

Various additional modifications will become apparent to those skilled in the art. All such variations which basically rely on the teachings through which the invention has advanced the art are properly considered within the scope of the invention.

It will be appreciated that the term "data field" in the appended claims is intended to include all headers exclusive of the header being added or subtracted at the portion supplying the modified CRC code.

It will be appreciated that the term "exclusive OR" as used here is considered to be identical to bit-wise addition or bit-wise subtraction.

We claim:

1. A method of re-transmitting an incoming data packet which includes a data field and a cyclic redundancy check code based on a first seed field having a first bit length comprising the steps of:
   receiving said data packet;
   generating a bit stream comprising:
      a second seed field,
      a first field comprising the exclusive OR function of at least a portion of the first seed field and at least a portion of a header, and
      a number of zeros equal to the bit length of the data field of the packet;
   loading said bit stream into a CRC generator to produce an updated CRC code;
   exclusive ORing the updated CRC code with the CRC code of the incoming packet to produce a modified CRC code for the data packet; and
   re-transmitting the modified data packet with the modified CRC code.

2. The method according to claim 1 wherein the first seed field is equal to the second seed field.

3. The method according to claim 1 wherein the bit stream further comprises a second field consisting of a remaining portion of the header in excess of the bit length of the first seed field.

4. The method according to claim 1 wherein the bit stream further comprises a second field consisting of a remaining portion of the first seed field in excess of the bit length of the header exclusive ORed with at least a portion of the second seed field.

5. The method according to claim 1 wherein the header is linked to the modified data packet prior to re-transmission.

6. The method according to claim 1 wherein the header is deleted from the incoming data packet.

7. The method according to claim 3 wherein the first field consists of the exclusive OR function of the first seed field and the number of least significant bits of the header equal to the bit length of the seed, and the second field consists of the most significant bits of the header in excess of the bit length of the seed field.

8. A circuit for re-transmitting an incoming data packet which includes a data field and a cyclic redundancy check code based on a first seed field having a first bit length comprising:
   means for receiving the incoming data packet;
   means for generating a bit stream which includes a second seed field, a field comprising the exclusive OR function of at least a portion of a header and at least a portion of the first seed field, and a string of zeros equal to the bit length of the data field of the incoming packet;
   a CRC generator;
   means for loading the bit stream into the generator;
   means for exclusive ORing the updated CRC code generated at the output of the generator with the CRC code of the incoming packet to produce a modified CRC code; and
   means for re-transmitting the data packet with the modified CRC code.

9. The circuit according to claim 8 wherein the means for generating the bit stream comprises a parallel-in, serial out shift register.

10. The circuit according to claim 9 wherein the means for generating the bit stream further comprises a bit-wise exclusive OR gate coupled to the shift register.

11. The circuit according to claim 8 wherein the means for receiving the incoming packet comprises a serial shift register.

12. The circuit according to claim 8 wherein the means for re-transmitting the data packet comprises a multiplexer.

13. The circuit according to claim 8 wherein the means for exclusive ORing the updated CRC code and the CRC code of the incoming packet comprises an exclusive OR gate with an input coupled to the CRC generator, an input coupled to the means for receiving the packet, and an output coupled to the means for re-transmitting the data packet.

14. The circuit according to claim 8 further comprising means for calculating the header based on the position of the circuit in a channel bank.

* * * * *